(12) United States Patent
Jung et al.

(10) Patent No.: US 7,366,038 B2
(45) Date of Patent: Apr. 29, 2008

(54) CIRCUIT AND METHOD OF DRIVING A WORD LINE OF A MEMORY DEVICE

(75) Inventors: Jong-Hoon Jung, Yongin-si (KR); Hyo-Sang Lee, Yongin-si (KR); Hoon-Jin Bang, Seoul (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 0 days.

(21) Appl. No.: 11/475,152

(22) Filed: Jun. 27, 2006

(65) Prior Publication Data

US 2007/0008805 A1    Jan. 11, 2007

(30) Foreign Application Priority Data

Jul. 5, 2005    (KR) ..................... 10-2005-0060329

(51) Int. Cl.
*G11C 5/14*    (2006.01)
(52) U.S. Cl. .............................. 365/189.09; 365/230.06
(58) Field of Classification Search ........... 365/189.09, 365/230.06
See application file for complete search history.

(56) References Cited

U.S. PATENT DOCUMENTS 5,467,032 A * 11/1995 Lee .............................. 326/88
6,657,915 B2 * 12/2003 Seo et al. ............... 365/230.06
7,269,091 B2 * 9/2007 Ueda ....................... 365/230.06

FOREIGN PATENT DOCUMENTS

| JP | 2000-105998 | 4/2000 |
|----|-------------|--------|
| JP | 2000-268575 | 9/2000 |
| JP | 2003-223794 | 8/2003 |

* cited by examiner

*Primary Examiner*—Amir Zarabian
*Assistant Examiner*—Kretelia Graham
(74) *Attorney, Agent, or Firm*—Harness, Dickey & Pierce, P.L.C.

(57) ABSTRACT

A word line driving circuit may include a first word line driver, a second word line driver and a pass transistor. In response to a word line selecting signal, the first word line driver may drive a word line using a first word line driving voltage signal in a first operation mode or the second word line driver may drive the word line using a second word line driving voltage signal. The pass transistor coupled between the first word line driver and the word line may transmit the first word line driving voltage signal to the word line in response to a control voltage signal, which is self-boosted at an initial stage of the first operation mode and is maintained at a stable voltage level after a time period.

18 Claims, 6 Drawing Sheets

CIRCUIT AND METHOD OF DRIVING A WORD LINE OF A MEMORY DEVICE

PRIORITY STATEMENT

This application claims the benefit of priority under 35 USC § 119 to Korean Patent Application No. 2005-60329, filed on Jul. 5, 2005, the entire contents of which are herein incorporated by reference.

BACKGROUND OF THE INVENTION

1. Field of the Invention

Example embodiments of the present invention relate to a circuit and a method of driving a word line of memory device, and more particularly to a circuit and a method for driving a word line of a nonvolatile memory device that may be embedded in a system-on-chip (SOC).

2. Description of the Related Art

Generally, it is desirable for portable devices, for example, cellular phones etc., to be small and thin to achieve a relatively high degree of portability. Accordingly, a system-on-chip (SOC) technique may be employed to integrate a plurality of elements, for example, a central processing unit (CPU), a digital signaling processor (DSP), memory, etc., into one chip, to reduce the size of the portable device.

A memory embedded in a SOC of a portable device may include volatile memory, for example, dynamic random-access memory (DRAM) and static random-access memory (SRAM), or nonvolatile memory, for example, flash memory, etc. A flash memory device may be used to store data, for example, identification codes used in encoding and/or decoding for communication security, even when power is deactivated due to, for example, an exhausted battery, etc. A NOR-type flash memory is generally used for high speed operation in the flash memory device embedded in a SOC.

The flash memory may have three operation modes. The three operation modes may include an erase operation mode, a program operation mode and a read operation mode. A voltage level applied to a cell may be varied according to the operation mode. Accordingly, a word line voltage applied to each cell should be selectively determined according to the operation mode.

FIG. 1 is a block diagram illustrating a conventional word line driving circuit.

A word line driver may include a word line driver 10 for a read and/or program mode and a word line driver 12 for an erase mode. The word line driver 10 for the read and/or program mode may receive a read driving voltage VRD or a program driving voltage VPGM and may provide the read driving voltage VRD (e.g., about 2.6V) or the program driving voltage VPGM (e.g., about 1V) to a word line WLi through a pass transistor 14 in response to a word line enable signal WL_ENi. The word line driver 12 for an erase mode may receive an erase driving voltage VERS (e.g., about 3.3V in a read mode and about 11.5V in an erase mode) and may provide the erase driving voltage VERS to the word line WLi in response to the word line enable signal WL_ENi. Therefore, a path for transmitting the read driving voltage VRD and the program driving voltage VPGM is separated from a path for transmitting the erase driving voltage VERS by using the pass transistor 14. Accordingly, in the erase operation, a breakdown of a transistor other than a high voltage transistor may be prevented.

A control voltage signal RDDRV (e.g., about 6V) may be applied to a gate terminal of the pass transistor 14 to activate the pass transistor 14 during the read and/or program operation mode. The control voltage signal RDDRV may be generated by an internal pumping circuit at a power voltage level. In order to perform a high speed operation using a conventional device, the internal pumping circuit may operate during a standby mode prior to when the power is turned on so that the voltage level of the control voltage signal RDDRV may be increased and maintained at an operation voltage level. If the internal pumping circuit is operating during the standby mode when a read command is input, the pass transistor 12 may be substantially immediately activated to drive the word line at a higher speed.

However, in the word line driving method described above, power consumption in the standby mode may be increased due to the operation of the internal pumping circuit during the standby mode.

One conventional approach to reduce the power consumption in the standby mode is to isolate the word line driver for the read and/or program operation mode from the word line driver for the erase operation mode, instead of generating the control voltage signal RDDRV. However, according to this conventional method, the size of a word line decoder may be increased. As such, this conventional method may not be suitable for a SOC.

Another conventional approach is to generate the control voltage signal RDDRV by a self-boosting method. In the self-boosting method, the control voltage signal RDDRV may be generated quickly without using the internal pumping circuit so that the power consumption in the standby mode may not be increased. However, for example, when the read operation is performed while changing a column address without any change of a row address, the gate voltage of the pass transistor may be maintained at a floating state for a long time period. However, a node voltage may become unstable causing a malfunction in a conventional device experiencing these circumstances. The node voltage may become unstable due to leakage current, noise, etc.

SUMMARY OF THE INVENTION

Example embodiments of the present invention are provided to reduce and/or substantially obviate one or more problems due to limitations and of the related art.

Example embodiments of the present invention provide a circuit and method for driving a word line of a memory device. The circuit for driving the word line may operate at higher speed while reducing power consumption in a standby mode.

A circuit and method for driving a word line of a memory device according to example embodiments of the present invention may reduce an area of the memory device by adapting a hybrid type of self-boosting and pumping.

An example embodiment of the present invention provides a circuit for driving a word line of a memory device. The circuit may include a first word line driver configured to drive a word line by applying a first word line driving voltage signal in a first operation mode, in response to a word line selection signal; a second word line driver configured to drive the word line by applying a second word line driving voltage signal in a second operation mode, in response to the word line selection signal; and a pass transistor, coupled between the first word line driver and the word line, configured to transmit the first word line driving voltage signal to the word line in response to a control voltage signal. The control voltage signal is self-boosted at an initial stage of the first operation mode and is maintained at a stable voltage level after a time period.

According to an example embodiment of the present invention, the control voltage signal may be precharged to a power voltage level in a standby mode, and the control voltage signal may maintain a self-boosted voltage level in the first operation mode. In response to the first word line driving voltage, the self-boosted voltage level may be attained from the power voltage level. In addition, the control voltage signal maintaining the stable voltage level may be generated by a pumping operation after a time period.

According to an example embodiment of the present invention, the circuit of driving a word line may further include a gate driving circuit configured to drive a gate of the pass transistor.

In an example embodiment of the present invention in which the pass transistor is implemented with one transistor, the gate driving circuit may include a precharge transistor, coupled between a gate of the pass transistor and a power voltage, configured to precharge the gate of the pass transistor to the power voltage in response to the second word line driving voltage signal; and a diode configured to couple the control voltage signal maintaining the stable voltage level to the gate of the pass transistor. The precharge transistor may be a native transistor.

In an example embodiment of the present invention in which the pass transistor is implemented with two transistors, the pass transistor may include a first transistor, coupled between the first word line driver and the word line, configured to operate in response to the self-boosted control voltage signal at the initial stage of the first operation mode; and a second transistor, coupled between the first word line driver and the word line, configured to transmit the first word line driving voltage signal to the word line in response to the control voltage signal maintaining the stable voltage level after the predetermined time period.

According to an example embodiment of the present invention, a size of the second transistor may be relatively smaller than a size of the first transistor, which may reduce power consumption during a pumping operation.

According to an example embodiment of the present invention, the first transistor may be coupled with the precharge transistor configured to precharge the gate of the pass transistor to a power voltage in response to the second word line driving voltage signal to couple the power voltage to the gate of the first transistor. The precharge transistor may be a native transistor.

According to an example embodiment of the present invention, the control voltage signal maintaining the stable voltage level and applied to a gate of the second transistor may be generated by a pumping operation after a time period.

An example embodiment of the present invention provides a method of driving a word line of a flash memory device. The method of driving the word line of the flash memory device may include precharging a gate of a pass transistor to a power voltage in a standby mode; generating a word line selection signal in response to a read command; applying a read voltage signal to the pass transistor in response to the word line selection signal; self-boosting a gate of the pass transistor in response to the applied read voltage signal; driving a selected word line by transmitting the read voltage signal through the self-boosted pass transistor; and maintaining a voltage applied to the word line. The voltage applied to the word line may be maintained by controlling the pass transistor to remain in an active state in response to a read control voltage signal that is pumped after an input of the read command. Therefore, the pass transistor may be driven by self-boosting in an initial stage of a read operation mode, and then may be stably driven by a control voltage signal that is pumped.

An example embodiment of the present invention provides a method for driving a word line of a flash memory device. The method for driving a word line of flash memory device may include: precharging a gate of a first pass transistor to a power voltage in a standby mode; generating a word line selection signal in response to a read command; applying a read voltage signal to the first pass transistor in response to the word line selection signal; self-boosting a gate of the first pass transistor in response to the applied read voltage signal; driving a selected word line by transmitting the read voltage signal through the self-boosted pass transistor; and maintaining an on-state of a second pass transistor that is activated by a read control voltage signal pumped after the read command.

BRIEF DESCRIPTION OF THE DRAWINGS

Example embodiments of the present invention will become more apparent to those of ordinary skill in the art from the following description of example embodiments of the present invention considered in combination with the attached drawings, wherein like elements are represented by like reference numerals. It is noted that the drawings are for explanatory purposes and thus, do not limit the example embodiments of the present invention.

DESCRIPTION OF THE EXAMPLE
EMBODIMENTS OF THE PRESENT
INVENTION

Hereinafter, example embodiments of the present invention will be explained in detail with reference to the accompanying drawings.

It will be understood that, although the terms first, second, etc. may be used herein to describe various elements, these elements should not be limited by these terms. These terms are used to distinguish one element from another. For example, a first element could be termed a second element, and similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
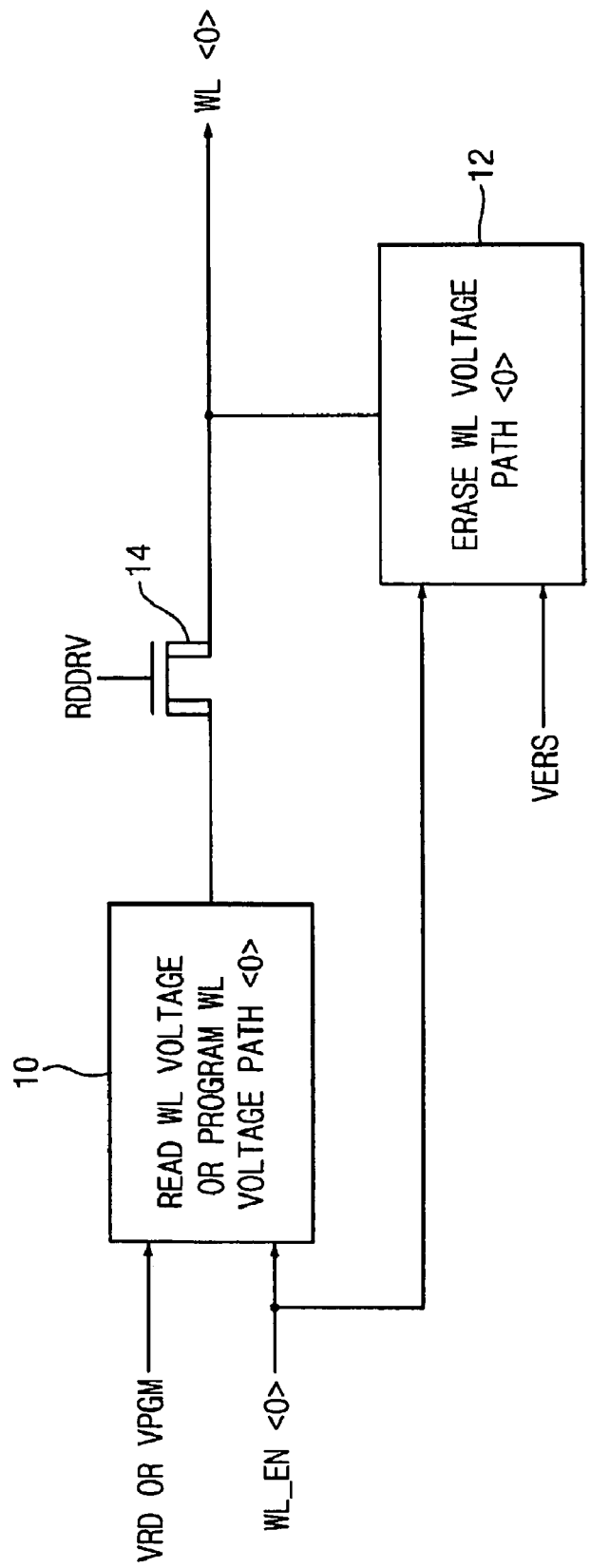
FIG. 1 is a block diagram illustrating a conventional word line driving circuit.
Figure 2:
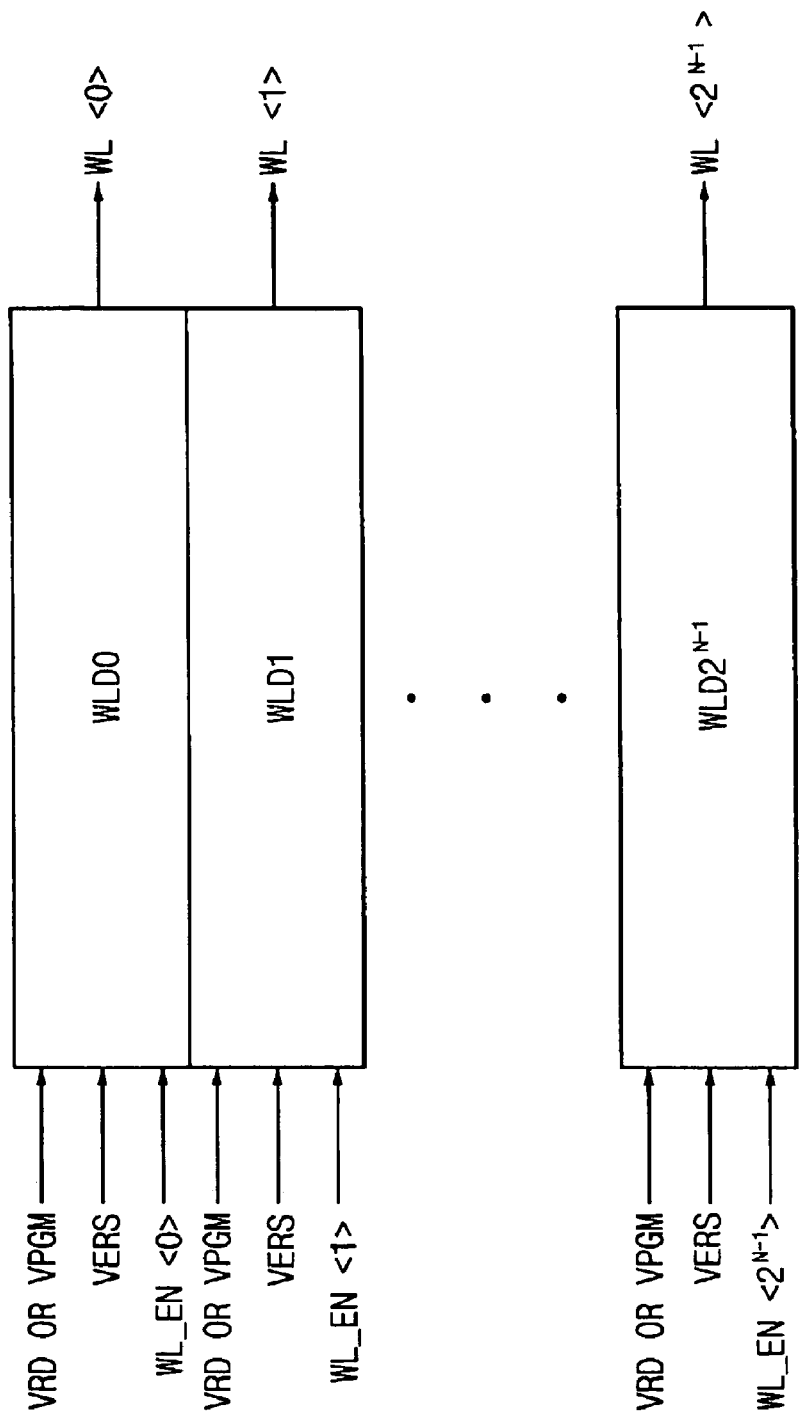
FIG. 2 is a block diagram illustrating a word line decoder of a flash memory according to an example embodiment of the present invention.
Figure 3:
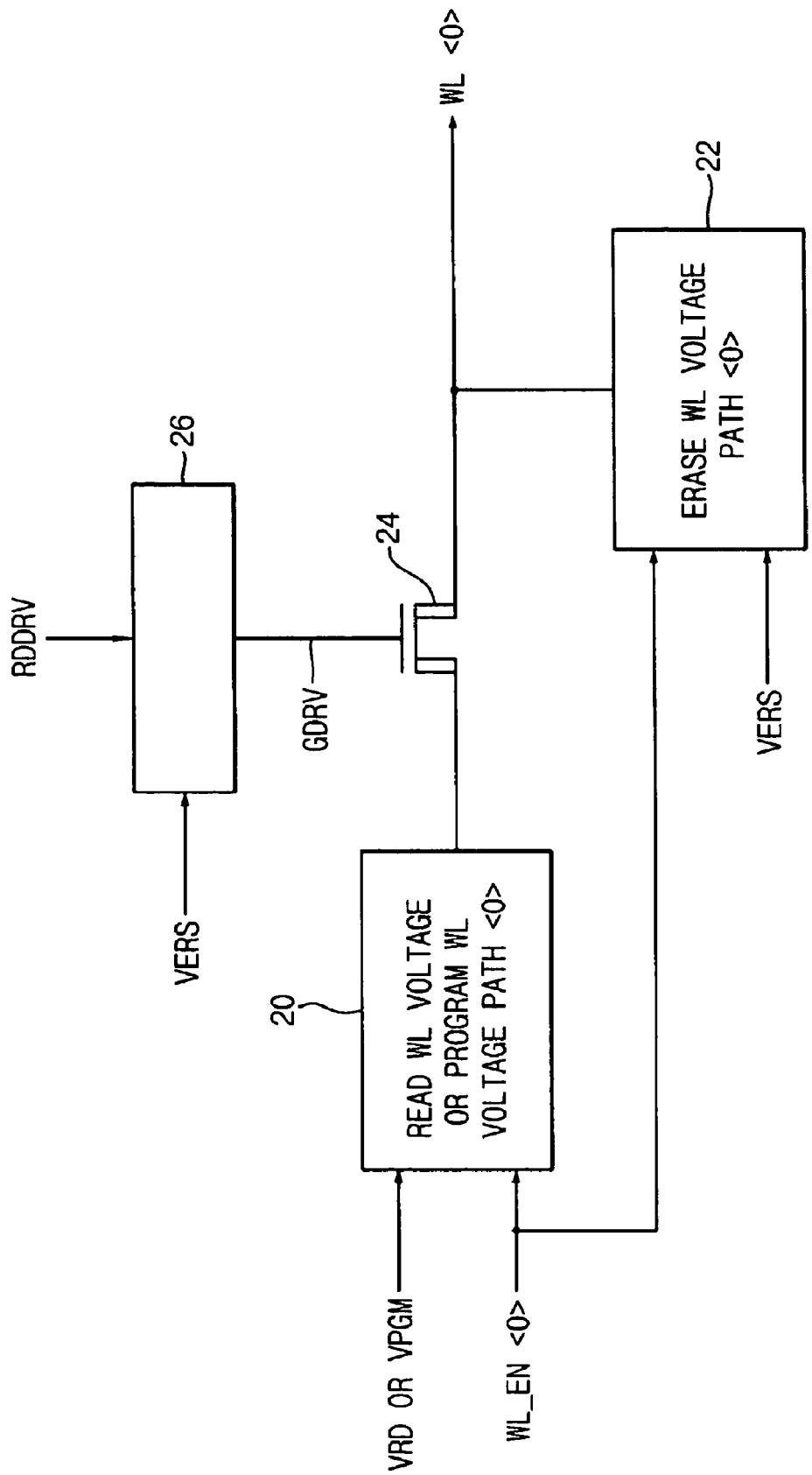
FIG. 3 is a block diagram illustrating a word line driving circuit in FIG. 2 according to an example embodiment of the present invention.

FIG. 2 is a block diagram illustrating a word line decoder of a flash memory according to an example embodiment of the present invention, and FIG. 3 is a block diagram illustrating a word line driving circuit in FIG. 2 according to an example embodiment of the present invention.

In an example embodiment of the present invention, a flash memory, which may be embedded in the SOC, may have a power voltage VCCH that is different than a read driving voltage VRD. For example, the power voltage VCCH (e.g., about 3.3V) may be higher than the read driving voltage VRD (e.g., about 2.6V).

A word line decoder may include $2^N$ word line drivers WLD0 through WLD$2^{N-1}$ to drive $2^N$ word lines. That is, the word line decoder may decode an N-bit row address and may activate one of the $2^N$ word line drivers to drive a corresponding word line.

As shown in FIG. 3, the word line driving circuit may include a word line driver 20 for a read and/or program mode, a word line driver 22 for an erase mode, a pass transistor 24, and a gate driving circuit 26 according to an example embodiment of the present invention.

The word line driver 20 for the read and/or program mode may receive a read driving voltage VRD or a program driving voltage VPGM and may provide the read driving voltage VRD (e.g., about 2.6V) or the program driving voltage VPGM (e.g., about 1V) to a word line WLi through a pass transistor in response to a word line enable signal WL_ENi.

The word line driver 22 for the erase mode may receive an erase driving voltage VERS (e.g., about 11.5V) and may provide the erase driving voltage VERS to the word line WLi in response to the word line enable signal WL_ENi in the erase operation mode. The erase driving voltage VERS may maintain a voltage level of about 3.3V during the read operation mode.

The pass transistor 24, which may be operated by relatively high voltage, may be deactivated during the erase operation mode, and may be activated during the read and/or program operation mode.

The gate driving circuit 26 may receive the erase driving voltage VERS and the read control voltage signal RDDRV to generate a gate driving voltage GDRV. The gate driving voltage GDRV may be provided to a gate terminal of the pass transistor 24.

Figure 4:
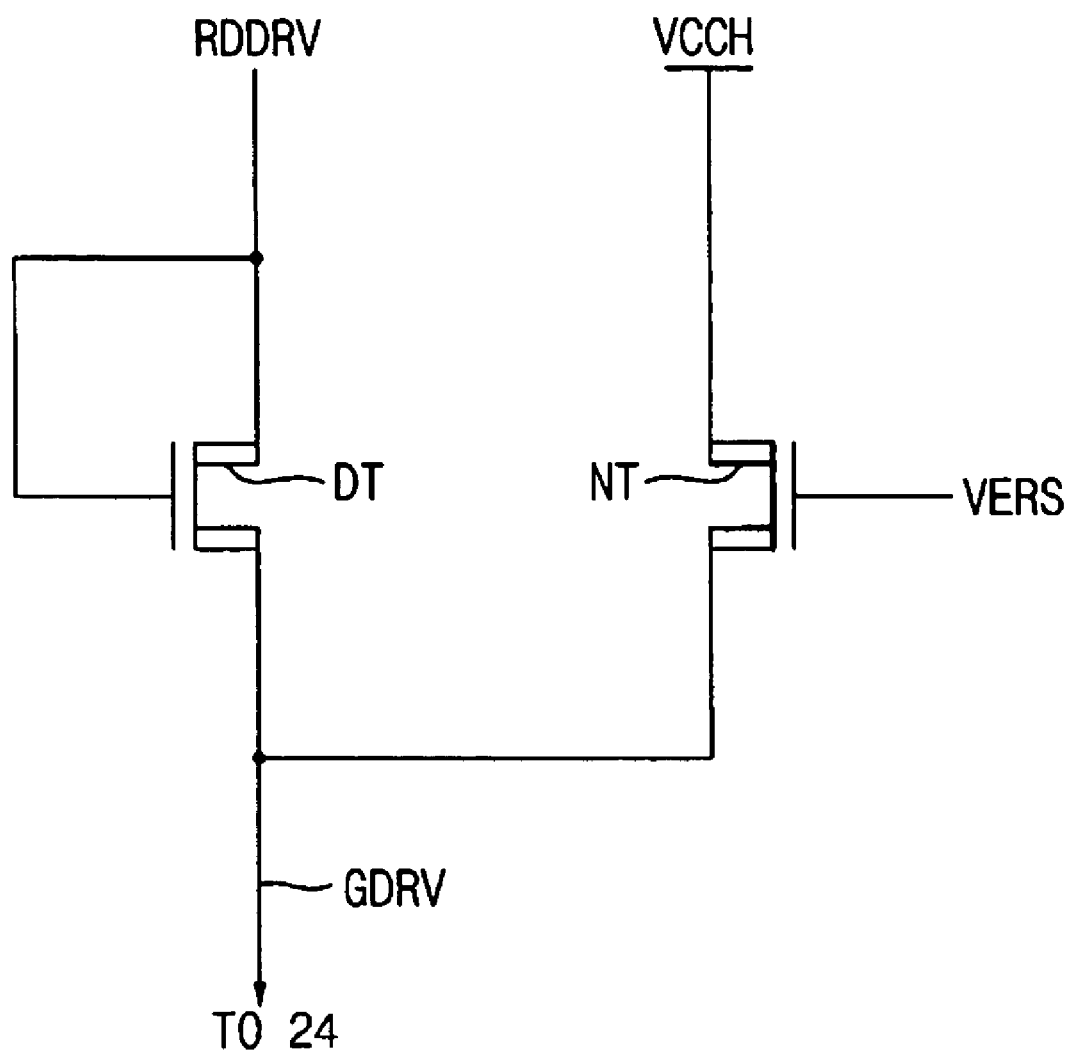
FIG. 4 is a circuit diagram illustrating a gate driving circuit in FIG. 3.

FIG. 4 is a circuit diagram illustrating the gate driving circuit according to an example embodiment of the present invention. The gate driving circuit described with respect to FIG. 4 may be used as the gate driving circuit 26 in FIG. 3.

Referring to FIG. 4, the gate driving circuit 26 may include a precharge transistor NT and a diode DT. The precharge transistor NT may have a native transistor structure with a threshold voltage of about 0V. The precharge transistor NT may provide a power voltage VCCH to a gate terminal of the pass transistor 24 in response to the erase driving voltage VERS. Therefore, the gate terminal of the pass transistor 24 may be precharged to the power voltage VCCH. The diode DT may electrically connect the read control voltage signal RDDRV provided by an internal pumping circuit (now shown) to the gate terminal of the pass transistor 24. The diode DT may be implemented as a diode connected transistor operating at a relatively high voltage where a gate and a drain may be commonly coupled.

According to an example embodiment of the present invention, if the word line enable signal WL_ENi is activated under the circumstances in which the gate terminal of the pass transistor 24 is precharged to the voltage level of VCCH (e.g., about 3.3V), the voltage level of an output of the word line driver 20 may be increased to about 2.6V. Accordingly, the gate terminal of the pass transistor 24 may be self-boosted from about 3.3V to about 5.8V by a parasitic coupling between the gate and drain terminals of the pass transistor so that the pass transistor 24 may be activated. Therefore, the read voltage signal (e.g., about 2.6V) may be applied to the word line WLi through the pass transistor 24. In addition, a mode of a memory system may be changed from a standby mode to an operation mode (e.g., read operation mode) and the internal pumping circuit may start operating. Consequently, the read control voltage signal RDDRV may be applied to the gate terminal of the pass transistor 24 stably after a delay of, for example, hundreds of nanoseconds, which may correspond to a time delay associated with the internal pumping circuit.

According to an example embodiment of the present invention, if a read command is received during a standby mode, the pass transistor 24 may be activated quickly by self-boosting to transmit the read driving voltage VRD, thereby driving the word line. In addition, the internal pumping circuit may operate during the operation mode to provide the read control voltage signal RDDRV to the gate terminal of the pass transistor 24 so that the pass transistor operates stably.

The erase driving voltage VERS may have a voltage level of about 11.5V to strongly drive the precharge transistor NT so that the gate voltage of the pass transistor 24 may be maintained at about 3.3V. Therefore, the possibility of the erase driving voltage VERS, which may have a voltage level of about 11.5V, applied to the word line being transmitted to a low voltage transistor area may be reduced.

According to an example embodiment of the present invention, the precharge transistor NT and the diode transistor DT may be coupled to the gate terminal of the pass transistor 24 substantially simultaneously. In addition, because the threshold voltage of the diode transistor DT may be increased due to a body effect, the voltage level applied to the gate terminal of the pass transistor 24 may be decreased. Accordingly, the voltage level of the read control voltage signal RDDRV may be pumped to exceed a common voltage level (e.g., about 6V) so that a voltage of about 6V may be applied to the gate terminal of the pass transistor 24.

Figure 5:
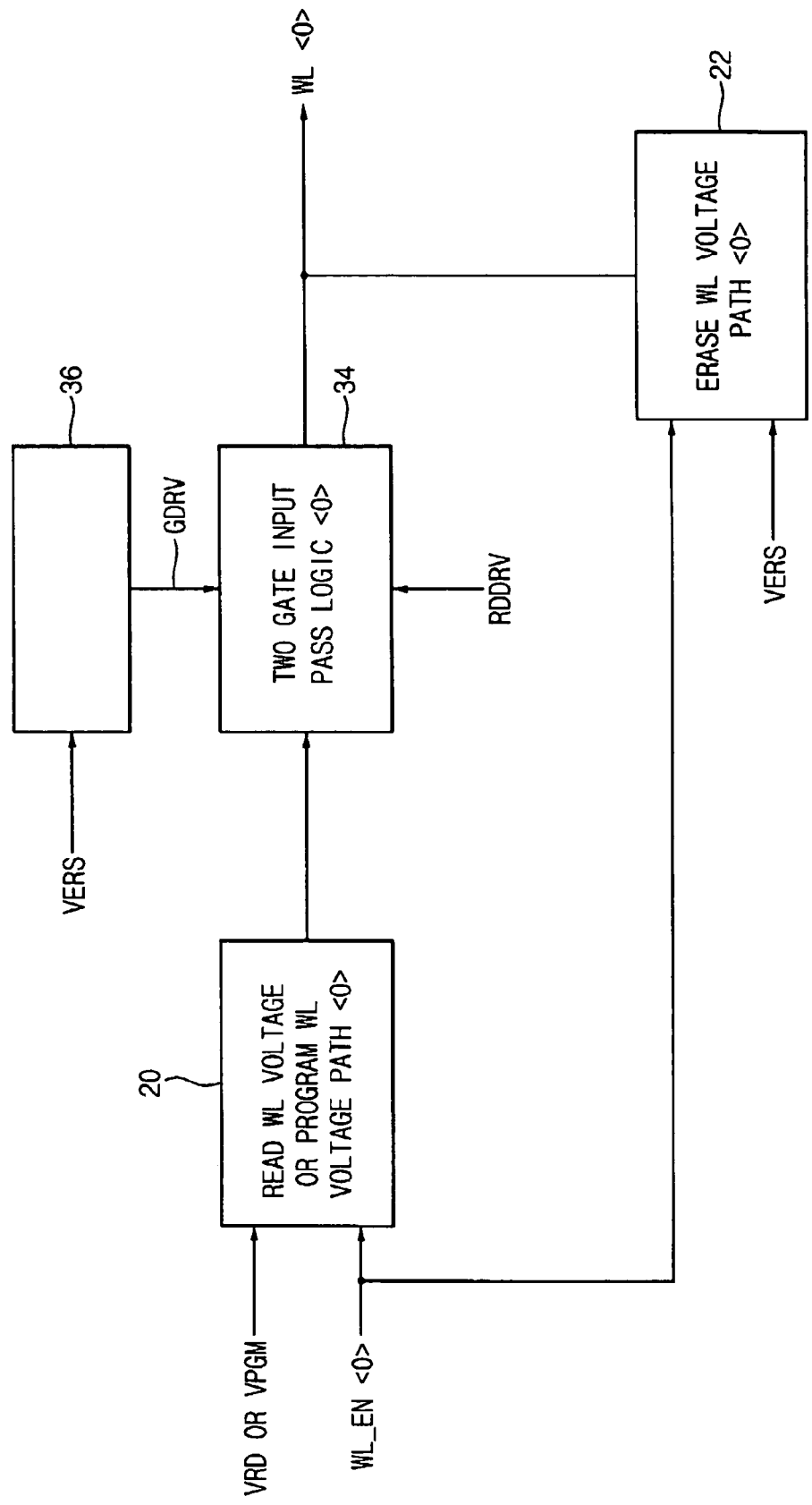
FIG. 5 is a block diagram illustrating a word line driver in FIG. 2 according to an example embodiment of the present invention.
Figure 6:
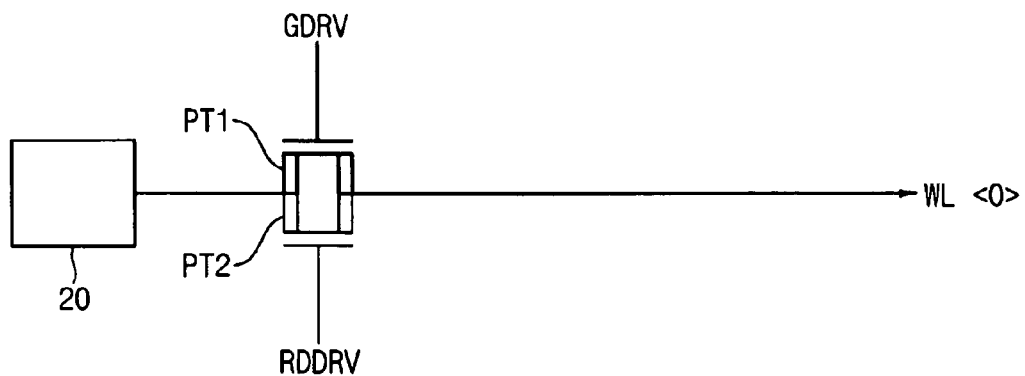
FIG. 6 is a block diagram illustrating a pass transistor in FIG. 5 according to an example embodiment of the present invention.
Figure 7:
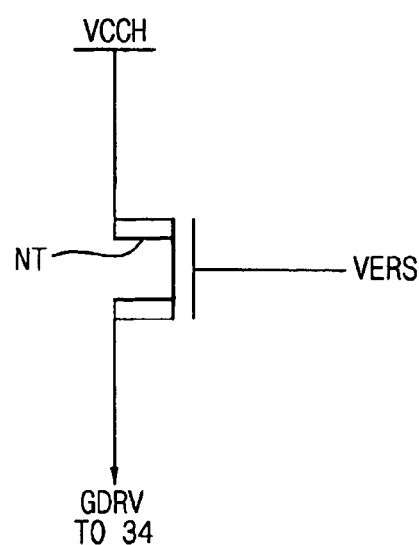
FIG. 7 is a circuit diagram illustrating a gate driving circuit in FIG. 5 according to an example embodiment of the present invention.

FIG. 5 is a block diagram illustrating a word line driving circuit in FIG. 2 according to an example embodiment of the present invention, FIG. 6 is a circuit diagram illustrating a pass transistor in FIG. 5 according to an example embodiment of the present invention, and FIG. 7 is a circuit diagram illustrating a gate driving circuit in FIG. 5 according to an example embodiment of the present invention. Same reference numerals denote same or similar elements as that of FIGS. 3 and 4 and therefore, a repeat description of the like elements will be omitted for the sake of brevity.

As shown in FIG. 5, a word line driving circuit according to an example embodiment of the present invention may include a word line driver 20 for a read and/or program mode, a word line driver 22 for an erase mode, a pass transistor 34 and a gate driving circuit 36.

As shown in FIG. 6, the pass transistor 34 may include two transistors. A gate terminal of a first pass transistor PT1 may be coupled to the gate driving circuit 36. The read control voltage signal RDDRV may be applied to a gate terminal of a second pass transistor PT2.

As shown in FIG. 7, the gate driving circuit 36 may include a native transistor NT, which may receive the erase driving voltage VERS at a gate terminal thereof, for providing a power voltage VCCH to a gate terminal of the first pass transistor PT1.

According to an example embodiment of the present invention, a size of the second pass transistor PT2 may be different from a size of the first pass transistor PT1. For example, the size of the second pass transistor PT2 may be decreased to reduce power consumption.

According to an example embodiment, if the word line enable signal WL_ENi is activated while the gate node of the first pass transistor PT1 is precharged to a voltage level of VCCH (e.g., about 3.3V), the output level of the word line driver 20 may be increased to a voltage level of about 2.6V. Accordingly, the gate terminal of the first pass transistor PT1 may be self-boosted from about 3.3V to about 5.8V by a parasitic coupling between the gate and drain terminals of the first pass transistor PT1 so that the first pass transistor PT1 may be activated.

Therefore, the read voltage signal (e.g., about 2.6V) may be applied to a word line WLi through the activated first pass transistor PT1. In addition, a mode of a memory system may be changed from a standby mode to an operation mode, and an internal pumping circuit may start operating. Consequently, the read control voltage signal RDDRV may be applied to a gate terminal of the second pass transistor PT2 through the internal pumping circuit, and the second pass transistor PT2 may be activated under a condition in which a voltage level of the read control voltage signal RDDRV increases to an operation level of about 6V after a delay of hundreds of nanoseconds, for example.

Because the word line may be driven using the first pass transistor PT1 and the second pass transistor PT2, even though the gate voltage of the first pass transistor PT1 may be maintained at a floating state for a relatively long time, which in conventional devices may lead to the driving voltage being be influenced by leakage current or noise, the word line driving voltage may be applied stably through the second pass transistor PT2 according to an example embodiment of the present invention.

The second pass transistor PT2 may be used to maintain the word line voltage at a constant voltage level according to an example embodiment of the present invention, so the second transistor PT2 may have a smaller size. Accordingly, the power consumption of the internal pumping circuit may be reduced. In addition, the efficiency of the self-boosting may be increased if the gate terminal of the self-boosted first pass transistor PT1 is coupled to a single native transistor NT according to an example embodiment of the present invention.

Therefore, according to an example embodiment of the present invention if a read command is received at during a standby mode, the pass transistor may be quickly activated by self-boosting to transmit the read driving voltage to the word line. In addition, the internal pumping circuit may operate in the subsequent operation mode (e.g., a read operation mode) to provide the read control voltage signal RDDRV to the gate terminal of the pass transistor 34 so that the pass transistor 34 may operate stably during the read mode, for example.

As described above, according to the example embodiments of the present invention, the word line driving voltage may be provided to the word line by using the self-boosting method when the read command is received at during a standby mode, and the word line driving voltage may be provided to the word line by operating the initial pumping circuit during the operation mode. Therefore, the power consumption in the standby mode may be decreased and stable transmission of the driving voltage to the word line may still be ensured. In addition, a chip area of the memory device may be reduced by using a hybrid method of self-boosting and pumping as described with respect to example embodiments of the present invention.

Having thus described example embodiments of the present invention, it is to be understood that the invention is not to be limited by particular details set forth in the above description and many apparent variations of the example embodiments of the present invention are possible without departing from the spirit or scope of the invention.

What is claimed is:

1. A circuit for driving a word line of a memory device comprising:
    a first word line driver configured to drive the word line by applying a first word line driving voltage signal in a first operation mode, in response to a word line selection signal;
    a second word line driver configured to drive the word line by applying a second word line driving voltage signal in a second operation mode, in response to the word line selection signal; and
    a pass transistor, coupled between the first word line driver and the word line, configured to transmit the first word line driving voltage signal to the word line in response to a control voltage signal, wherein the control voltage signal is precharged ("self-boosted") to a power voltage level at an initial stage of the first operation mode and the control voltage signal maintains a self-boosted voltage level in the first operation mode, the self-boosted voltage level being attained from the power voltage level in response to the second word line driving voltage.

2. The circuit of claim 1, wherein a voltage of the second word line driving voltage signal is higher than a voltage level of the first word line driving voltage signal.

3. The circuit of claim 1, wherein the control voltage signal maintaining the stable voltage level is generated by a pumping operation after a time period.

4. The circuit of claim 1, further comprising:
a gate driving circuit configured to drive a gate of the pass transistor.

5. The circuit of claim 4, wherein the gate driving circuit includes:
a precharge transistor, coupled between a gate of the pass transistor and a power voltage, configured to precharge the gate of the pass transistor to the power voltage in response to the second word line driving voltage signal; and
a diode configured to couple the control voltage signal maintaining the stable voltage level to the gate of the pass transistor.

6. The circuit of claim 5, wherein the precharge transistor is a native transistor.

7. The circuit of claim 1, wherein the pass transistor includes:
a first transistor, coupled between the first word line driver and the word line, configured to operate in response to the self-boosted control voltage signal at the initial stage of the first operation mode; and
a second transistor, coupled between the first word line driver and the word line, configured to transmit the first word line driving voltage signal to the word line in response to the control voltage signal maintaining the stable voltage level after a time period.

8. The circuit of claim 7, wherein a size of the second transistor is relatively smaller than a size of the first transistor.

9. The circuit of claim 7, further comprising:
a precharge transistor configured to precharge the gate of the pass transistor to a power voltage in response to the second word line driving voltage signal to couple the power voltage to the gate of the first transistor.

10. The circuit of claim 7, wherein the control voltage signal maintaining the stable voltage level and applied to a gate of the second transistor is generated by a pumping operation after the predetermined time period.

11. The circuit of claim 9, wherein the precharge transistor is a native transistor.

12. The circuit of claim 1, wherein
the first word line driver is a read mode driver applying a read voltage signal in a read operation mode, in response to the word line selection signal;
the second word line driver is an erase mode driver applying an erase voltage signal in an erase operation mode, in response to the word line selection signal; and
the pass transistor is configured to transmit the read voltage signal as the first word line driving voltage to the word line using the self-boosted control voltage signal at an initial stage of the read operation mode and a read control voltage signal after a time period.

13. The circuit of claim 12, wherein the read control voltage signal is precharged to a power voltage level in a standby mode, and the read control voltage signal maintains a self-boosted voltage level in the read operation mode, the self-boosted voltage level being attained from the power voltage level, in response to the read voltage signal.

14. The circuit of claim 12, wherein the read control voltage signal is generated by a pumping operation after the time period.

15. The circuit of claim 12, wherein the memory device is an embedded flash memory device, and a level of the power voltage is higher than a voltage level of the read voltage signal.

16. A method of driving a word line of a flash memory device comprising:
precharging a gate of a pass transistor to a power voltage in a standby mode, the pass transistor being configured to transmit a first word line driving voltage signal to the word line in response to a control voltage signal that is precharged ("self-boosted") to a power voltage level in the standby mode and maintains a self-boosted voltage level in a first operation mode, wherein the self-boosted voltage level is attained from the power voltage level in response to a second word line driving voltage;
generating a word line selection signal in response to a read command;
applying a read voltage signal to the pass transistor in response to the word line selection signal;
self-boosting the gate of the pass transistor in response to the applied read voltage signal;
driving a selected word line by transmitting the read voltage signal through the self-boosted pass transistor; and
maintaining a voltage applied to the word line.

17. The method of claim 16, wherein maintaining the voltage comprises:
controlling the pass transistor to remain in an activated state in response to a read control voltage signal that is pumped after an input of the read command.

18. The method of claim 16, wherein maintaining the voltage comprises:
activating a second pass transistor in response to a read control voltage signal pumped after the read command.

* * * * *